United States Patent [19]

Johnson et al.

[11] Patent Number: 5,343,437
[45] Date of Patent: Aug. 30, 1994

[54] MEMORY HAVING NONVOLATILE AND VOLATILE MEMORY BANKS

[75] Inventors: Mark J. Johnson, Algonquin, Ill.; Brian D. Branson, Austin, Tex.

[73] Assignee: Motorola Inc., Schaumburg, Ill.

[21] Appl. No.: 19,492

[22] Filed: Feb. 19, 1993

[51] Int. Cl.⁵ .................................................. G11C 8/00
[52] U.S. Cl. .............................. 365/230.03; 365/230.05; 365/228
[58] Field of Search ................... 365/230.03, 154, 190, 365/226, 228, 230.02, 230.05

[56] References Cited

U.S. PATENT DOCUMENTS

| | | | |
|---|---|---|---|
| 4,168,541 | 9/1979 | DeKarske | 365/230 |
| 4,354,255 | 10/1982 | Stewart | 365/154 |
| 4,488,265 | 12/1984 | Kotecha | 365/189 |
| 4,686,652 | 8/1987 | Spence | 365/154 X |
| 4,706,220 | 11/1987 | Spence | 365/154 X |
| 4,800,533 | 1/1989 | Arakawa | 365/228 |
| 4,954,988 | 9/1990 | Robb | 365/189 |
| 4,996,641 | 2/1991 | Talgam et al. | 364/200 |
| 5,119,336 | 6/1992 | Itoh | 365/195 |

FOREIGN PATENT DOCUMENTS 62-291168  12/1987  Japan .............................. 365/230.03

*Primary Examiner*—Joseph A. Popek
*Attorney, Agent, or Firm*—Daniel D. Hill

[57] ABSTRACT

A memory (20) includes a nonvolatile memory array (32) and a volatile memory array (22). The nonvolatile memory array (32) is subdivided into banks of memory cells. The volatile memory array (22) may also be subdivided into multiple banks, and is smaller than the nonvolatile memory array (32). A transfer circuit (40) transfers the contents of a bank of nonvolatile memory array (32) into a bank of volatile memory array (22) before the data can be accessed by a processor (160). In addition, a preload decision logic circuit (180) may transfer a bank of nonvolatile memory array (32) into volatile memory array (22) invisibly to the processor (160), to have the data available when needed, thus avoiding a space fault. Coupling a smaller volatile memory array (22) to a nonvolatile memory array (32) combines the advantages of faster access times and nonvolatility without greatly increasing the size of the memory (20).

25 Claims, 7 Drawing Sheets

MEMORY HAVING NONVOLATILE AND VOLATILE MEMORY BANKS

FIELD OF THE INVENTION

This invention relates generally to memories, and more particularly, to a random access memory having banks of nonvolatile and volatile memory cells.

BACKGROUND OF THE INVENTION

In general, semiconductor memories may be divided into two types, volatile memories and nonvolatile memories. Volatile memories lose stored data when power is removed, whereas nonvolatile memories, retain stored data when power is removed. Static random access memories (SRAMs) and dynamic random access memories (DRAMs) are two types of volatile memories. An SRAM cell is comprised of a bistable flip-flop, and data is stored by setting the state of the bistable flip-flop. In a DRAM cell, a capacitor is used to store data.

There are several types of nonvolatile memories. Read only memory (ROM) is a type of nonvolatile memory that is preprogrammed in the silicon by the semiconductor manufacturer. The preprogrammed contents of a ROM cannot be altered. Another type of nonvolatile memory is the Erasable Programmable Read Only Memory (EPROM). EPROMs can be erased and reprogrammed by the user using special ultraviolet light equipment. The Electrically Erasable Programmable Read Only Memory (EEPROM) is a type of nonvolatile memory that is reprogrammable without the special equipment needed for EPROMs. ROMs, EPROMs, and EEPROMs may be fabricated in relatively high density.

Nonvolatile memory is used in various ways in the design of digital systems. For example, nonvolatile memory may be used to store the standard program needed for enabling the various operations of a microprocessor. Also, nonvolatile memory may be used to provide look-up tables needed in some mathematical functions, or for the display of characters. In addition, nonvolatile memory is used in the design of control units for computers to store the sequence of control variables needed for enabling the various operations in the computer.

Nonvolatile memories have several disadvantages as compared to volatile memories such as SRAMSs. Nonvolatile memories suffer from relatively long access times, and they require relatively high power supply voltages for programming and for high speed operation. The relatively long access time of the nonvolatile memory may be reduced by using various circuit improvements, but the reduction in access time usually results in increased power consumption, or larger die sizes, with marginal increases in performance. In integrated circuits, it is common practice to use a lower power supply voltage to decrease power consumption. However, if a lower supply voltage is used with a nonvolatile memory, (for example, 3.3 volts), the long access time of the nonvolatile memory may be further increased.

Another solution to the problem of slow access times of nonvolatile memories has been to copy data from a nonvolatile memory array to a volatile memory array, upon power-up of the system. Then, the microprocessor in the system only has to access the SCRAM or DRAM. A disadvantage of this solution is that there needs to be as much volatile memory in the system as there is nonvolatile memory, substantially increasing the cost of the system. Also, a substantial amount of time is required to down load the contents of the nonvolatile memory into the volatile memory. The processor must wait until this transfer is complete before performing any other operations.

SUMMARY OF THE INVENTION

Accordingly, there is provided, in one form, an integrated circuit memory, having a nonvolatile memory array, a volatile memory array, and a transfer circuit. The nonvolatile memory array has a plurality of banks of nonvolatile memory cells. Each nonvolatile memory cell is coupled to a bit line and a word line. The volatile memory array has a plurality of volatile memory cells. Each volatile memory cell is coupled to a word line and a bit line pair. The volatile memory array has the same number of memory cells as a single bank of the plurality of banks of nonvolatile memory cells. The transfer circuit is coupled to the nonvolatile memory array and to the volatile memory array. The transfer circuit receives an address signal and selectively transfers data from a bank of the nonvolatile memory cell array to the volatile memory cell array. These and other features and advantages will be more clearly understood from the following detailed description taken in conjunction with the accompanying drawings.

DESCRIPTION OF A PREFERRED EMBODIMENT

The present invention provides a way to preserve the advantages of nonvolatile memories while also providing the performance advantages of high-speed volatile memories such as SRAMs.

Figure 1:
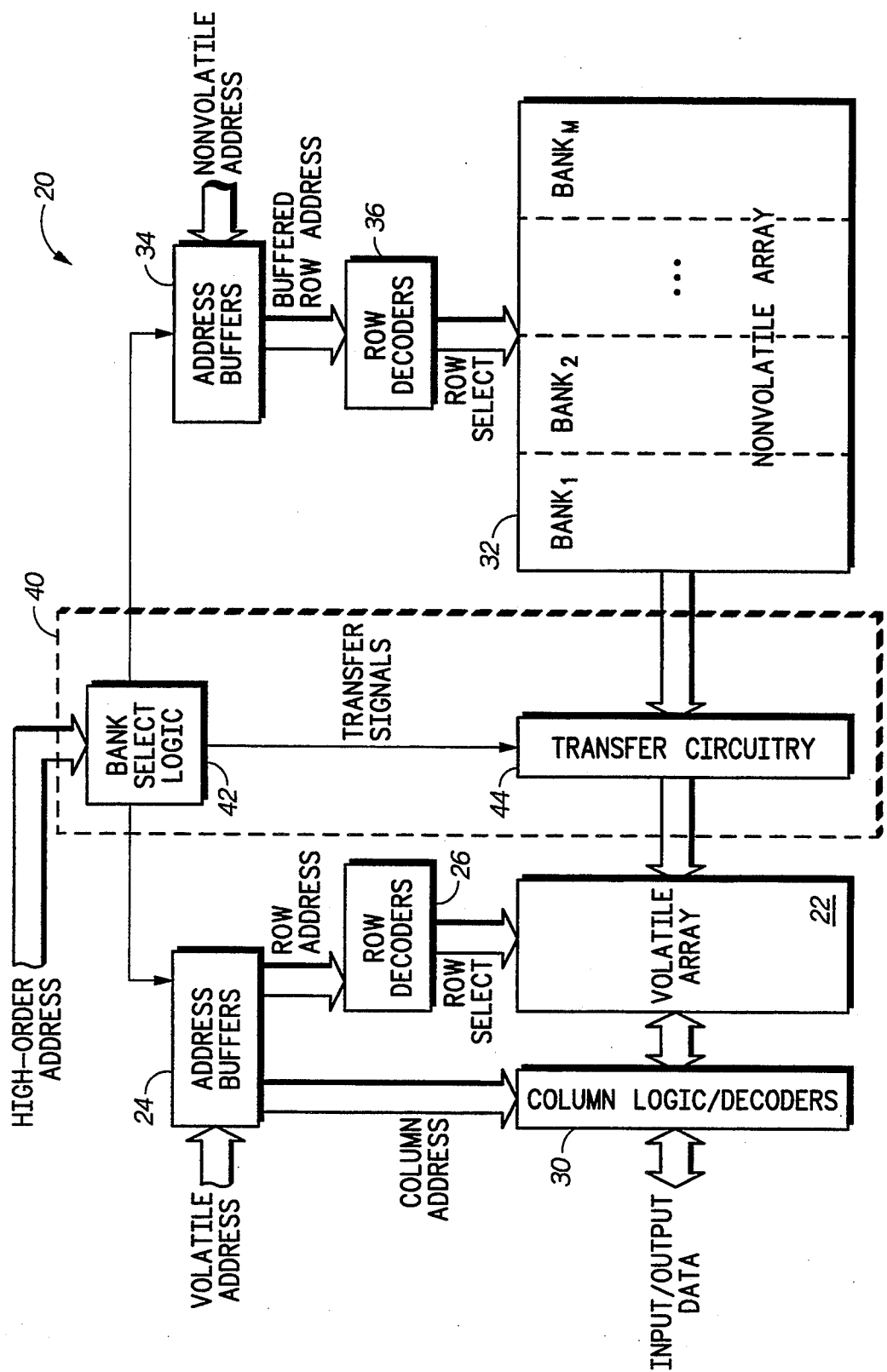
FIG. 1 illustrates in block diagram form a memory in accordance with one embodiment of the present invention.

FIG. 1 illustrates in block diagram form memory 20 in accordance with one embodiment of the present invention. Memory 20 includes volatile memory array 22, address buffers 24 and 34, row decoders 26 and 36, column logic/decoders 30, nonvolatile memory array 32, and transfer circuit 40. Transfer circuit 40 includes bank select logic circuit 42 and transfer circuitry 44.

Volatile memory array 22 includes a plurality of memory cells. The memory cells are located at intersections of word lines and bit line pairs. External address signals labeled "VOLATILE ADDRESS" are provided to address buffers 24. Address buffers 24 provide buffered row address signals labeled "ROW ADDRESS" to row decoders 26, and buffered column address signals labeled "COLUMN ADDRESS" to column logic/decoders 30. Row decoders 26 provide row select signals labeled "ROW SELECT" to select a word line of volatile memory array 22, and column logic/decoders 30 provides decoded column address signals to select a bit line pair of volatile memory array 22. Column logic/decoders 30 are coupled to each bit line pair of volatile memory array 22. RAM input/output data is labeled "INPUT/OUTPUT DATA". During a write cycle, input data is received by column logic/decoders 30, and during a read cycle, output data is provided by column logic/decoders 30. Additional input/output circuitry such as data input buffers, data output buffers, and level converter circuitry is not shown for the purpose of clarity.

Nonvolatile memory array 32 includes a plurality of nonvolatile memory cells arranged as banks of memory cells labeled "BANK$_1$", "BANK$_2$", and "BANK$_M$". Nonvolatile memory cells are located at intersections of word lines and bit lines. Nonvolatile address signals labeled "NONVOLATILE ADDRESS" are provided to address buffers 34. Row decoders 36 provide row select signals labeled "ROW SELECT" to nonvolatile memory array 32.

Transfer circuit 40 couples volatile memory array 22 to nonvolatile memory array 32 and provides for the downloading, or the transferring, of the contents of a bank of nonvolatile memory array 32 to volatile memory array 22. Bank select logic circuit 42 receives high-order address signals labeled "HIGH-ORDER ADDRESS", and provides control signals labeled "TRANSFER SIGNALS" to transfer circuitry 44, thereby controlling which of bank of nonvolatile memory array 32 is to be loaded into volatile memory array 22. Bank select logic circuit 42 determines which bank of nonvolatile memory array 32 is to be transferred to volatile memory array 22. Address signals HIGH ORDER ADDRESS are simply the higher-order address bits of a row address of nonvolatile memory array 32. Many adjacent address locations share the same higher-order address bits. The number of higher-order address bits needed depends on the size of a bank of nonvolatile memory array 32.

In a preferred embodiment, volatile memory array 22 includes SRAM cells and is directly accessible to a data processing system for read/write operations. In another embodiment, volatile memory array 22 may include DRAM cells. Nonvolatile memory array 32 includes either ROM, PROM, EPROM, EEPROM, or other type of nonvolatile memory having relatively slow access times. Nonvolatile memory array 32 is not directly accessible. The stored data of a bank of nonvolatile memory array 32 is first transferred into volatile memory array 22 before it is accessible to a data processing system. The number of memory cells in volatile memory array 22 is equal to the number of memory cells in one bank of nonvolatile memory array 32. Bank select logic circuit 42 provides control signals TRANSFER SIGNALS to determine the location in nonvolatile memory array 32 to be transferred by transfer circuitry 44. Details of one embodiment of transfer circuit 40 is illustrated in FIG. 2.

Figure 2:
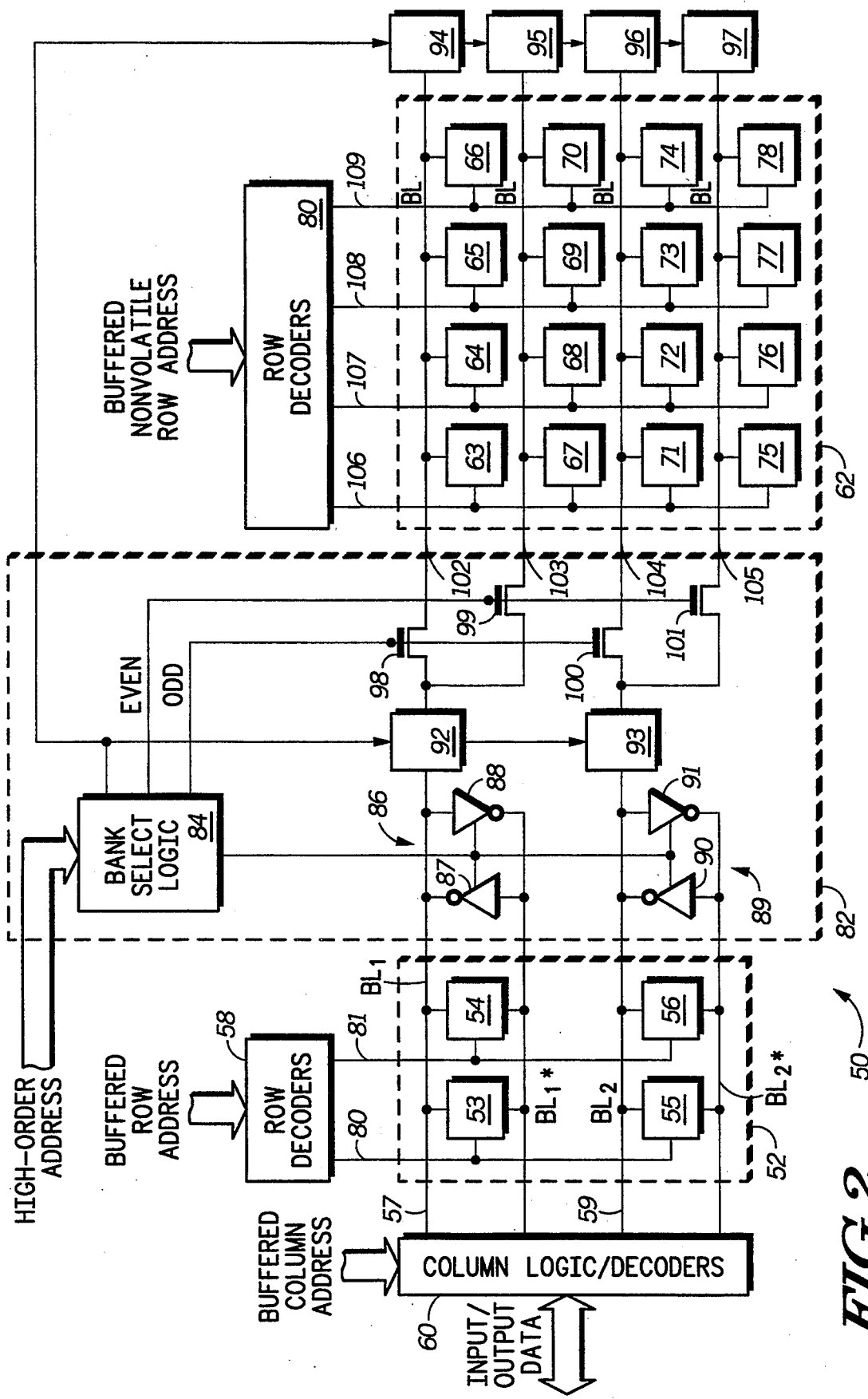
FIG. 2 illustrates in partial block diagram form, partial logic diagram form, and partial schematic diagram form one embodiment of the memory of FIG. 1.

FIG. 2 illustrates in partial block diagram form, partial logic diagram form, and partial schematic diagram form memory 50 in accordance with one embodiment of memory 20 of FIG. 1. Memory 50 includes volatile memory array 52, row decoders 58 and 80, RAM column logic/decoders 60, nonvolatile memory array 62, transfer circuit 82, and bit line precharge circuits 92–97. Volatile memory array 52 is a SRAM and includes SRAM cells 53–56. SRAM cells 53 and 54 are connected between bit line pair 57, and SRAM cells 55 and 56 are connected between bit line pair 59. Bit line pair 57 is labeled "BL$_1$" and "BL$_1$*", and bit line pair 59 is labeled "BL$_2$" and "BL$_2$*". (Note that an asterisk after a signal name indicates that the signal is active at a logic low.) Bit line pairs 57 and 59 are connected to column logic/decoders 60. Word lines 80 and 81 are connected to SRAM cells 53 and 55. Word line 81 is connected to SRAM cells 54 and 56. Word lines 80 and 81 are also connected to row decoders 58. Each of SRAM cells 53–56 stores a single bit of binary data.

Nonvolatile memory array 62 includes nonvolatile memory cells 63–78. Memory cells 63–66 are coupled to bit line 102. Memory cells 67–70 are connected to bit line 103. Memory cells 71–74 are connected to bit line 104. Memory cells 75–78 are connected to bit line 105. Word line 106 is connected to memory cells 63, 67, 71, and 75. Word line 107 is connected to memory cells 64, 68, 72, and 76. Word line 108 is connected to memory cells 65, 69, 73, and 77. Word line 109 is connected to memory cells 66, 70, 74, and 78. Bit line precharge circuit 94 is connected to bit line 102. Bit line precharge circuit 95 is connected to bit line 103. Bit line precharge circuit 96 is connected to bit line 104. Bit line precharge circuit 97 is connected to bit line 105. Each of memory cells 63–78 stores a single bit of binary data. Note that only four memory cells are shown in volatile memory array 52, and 16 memory cells are shown in nonvolatile memory array 62 for clarity and for ease of explanation. An actual memory contains many more memory cells.

Transfer circuit 82 includes bank select logic circuit 84, cross-coupled latching amplifiers 86 and 89, and N-channel pass transistors 98–101. Bank select logic circuit 84 receives high-order address signals labeled "HIGH-ORDER ADDRESS", and provides bit line precharge control signals labeled "BIT LINE PRECHARGE", data transfer control signals labeled "EVEN" and "ODD", and an enable signal to cross-coupled latching amplifiers 86 and 89. Cross-coupled latching amplifier 86 includes inverter circuits 87 and 88. Cross-coupled latching amplifier 89 includes inverter circuits 90 and 91. Cross-coupled latching amplifier 86 is coupled to bit line pair 57 and to bit line precharge circuit 92. Cross-coupled latching amplifier 89 is coupled to bit line pair 59 and to bit line precharge circuit 93. Bank select logic circuit 84 provides bit line precharge control signal BIT LINE PRECHARGE to bit line precharge circuits 92–97.

N-channel pass transistor 98 has a first current electrode connected to precharge circuit 92, a second current electrode connected to bit line 102, and a gate connected to bank select logic circuit 84 for receiving data transfer control signal ODD. N-channel transistor 99 has a first current electrode connected to precharge circuit 92, a second current electrode connected to bit line 103, and a gate connected to bank select logic circuit 84 for receiving data transfer control signal EVEN. N-channel transistor 100 has a first current electrode connected to precharge circuit 93, a second current electrode connected to bit line 104, and a gate connected to bank select logic circuit 84 for receiving data transfer control signal ODD. N-channel transistor 101 has a first current electrode connected to precharge circuit 93, a second current electrode connected to bit line 105, and a gate connected to bank select logic circuit 84 for receiving data transfer control signal EVEN. N-channel transistors 98-101 function as pass transistors, or transfer gates, to couple nonvolatile memory array 62 to volatile memory array 52.

When volatile memory array 52 is being accessed for a read/write operation, bank select logic circuit 84 provides data transfer control signals EVEN and ODD at logic low voltages, causing N-channel pass transistors 98-101 to be substantially non-conductive. This decouples nonvolatile memory array 62 from volatile memory array 52. Volatile memory array 52 functions as a conventional random access memory and can supply data at relatively high speeds. Differential data signals are provided by volatile memory array 52 to column logic/decoders 60 during a read cycle of memory 50. Column logic/decoders 60 provides single-ended output data labeled. "INPUT/OUTPUT DATA". Data may also be written to volatile memory array 52, thus adding the advantage of flexibility to the advantage of nonvolatility.

Transfer circuit 82 couples a dense, single bit line nonvolatile memory array architecture to a double bit line volatile memory array architecture. As described in conjunction with FIG. 1, the high-order address bits are used to initiate a memory transfer from nonvolatile memory array 62 to volatile memory array 52. To initiate a transfer from nonvolatile memory array 62 to volatile memory array 52, the bit line pairs of volatile memory array 52 and the bit lines of nonvolatile memory array 62 are momentarily precharged to a predetermined voltage by precharge circuits 92-97. This sets cross coupled latching amplifiers 86 and 89 to a predetermined logic state, either a logic high or a logic low. Next, nonvolatile memory address signals BUFFERED NONVOLATILE ROW ADDRESS are provided to row decoders 80 to activate a single word line of word lines 106-109. Bank select logic circuit 84 provides a logic high EVEN or ODD data transfer control signal to N-channel pass transistors 98-101. If data transfer control signal EVEN is asserted as a logic high, N-channel pass transistors 99 and 101 are conductive, thus coupling bit lines 103 and 105 to bit line pairs 57 and 59. This allows nonvolatile bit lines 103 and 105 to write into cross-coupled latching amplifiers 86 and 89, respectively, and overwrite the precharge voltage if necessary. Once sufficient voltage differential has been developed on volatile memory bit line pairs 57 and 59, row address signals BUFFERED ROW ADDRESS is provided to row decoders 58 to select a single word line. All of the columns connected to the selected word line of volatile memory array 52 are written to simultaneously.

Transfer circuit 82 may be extended to include additional transfer paths such that more than two nonvolatile columns could be multiplexed onto the same volatile memory bit line pair. This would require additional control lines and pass transistors, but would allow a larger volatile memory bit cell layout to be interfaced to the dense nonvolatile memory layout.

The process described above can be applied to any conventional RAM and nonvolatile memory using standard read/write techniques, and is not limited to any particular depth or width of memory array. The speed of a single transfer is limited only by the time required to precharge the bit lines, bit line pairs and cross-coupled latching amplifiers, select a source word line, enable the N-channel pass transistors, write the cross-coupled latching amplifiers with the nonvolatile bit line information, select a destination word line, and overwrite the information of the bit line pairs.

Whenever an address is provided to volatile memory array 52 during a normal access and the address is not located in volatile memory array 52, a "space fault" occurs, and a new bank of nonvolatile memory array 62 is transferred to volatile memory array 52 before the access can be completed.

Memory 20 of FIG. 1 is most useful in a Harvard style architecture where there are separate, independent instruction buses and data buses. In this type of architecture, a space fault would occur less frequently than if a von Neumann style architecture is used. In a von Neumann style architecture, instructions and data share the same bus, so a space fault may occur more frequently as the data processor moves between instructions and data. Therefore, for a von Neumann style architecture, where instructions and data share the same bus, memory 110 of FIG. 3 would be more useful for reducing the number of space faults caused when switching between instructions and data.

Figure 3:
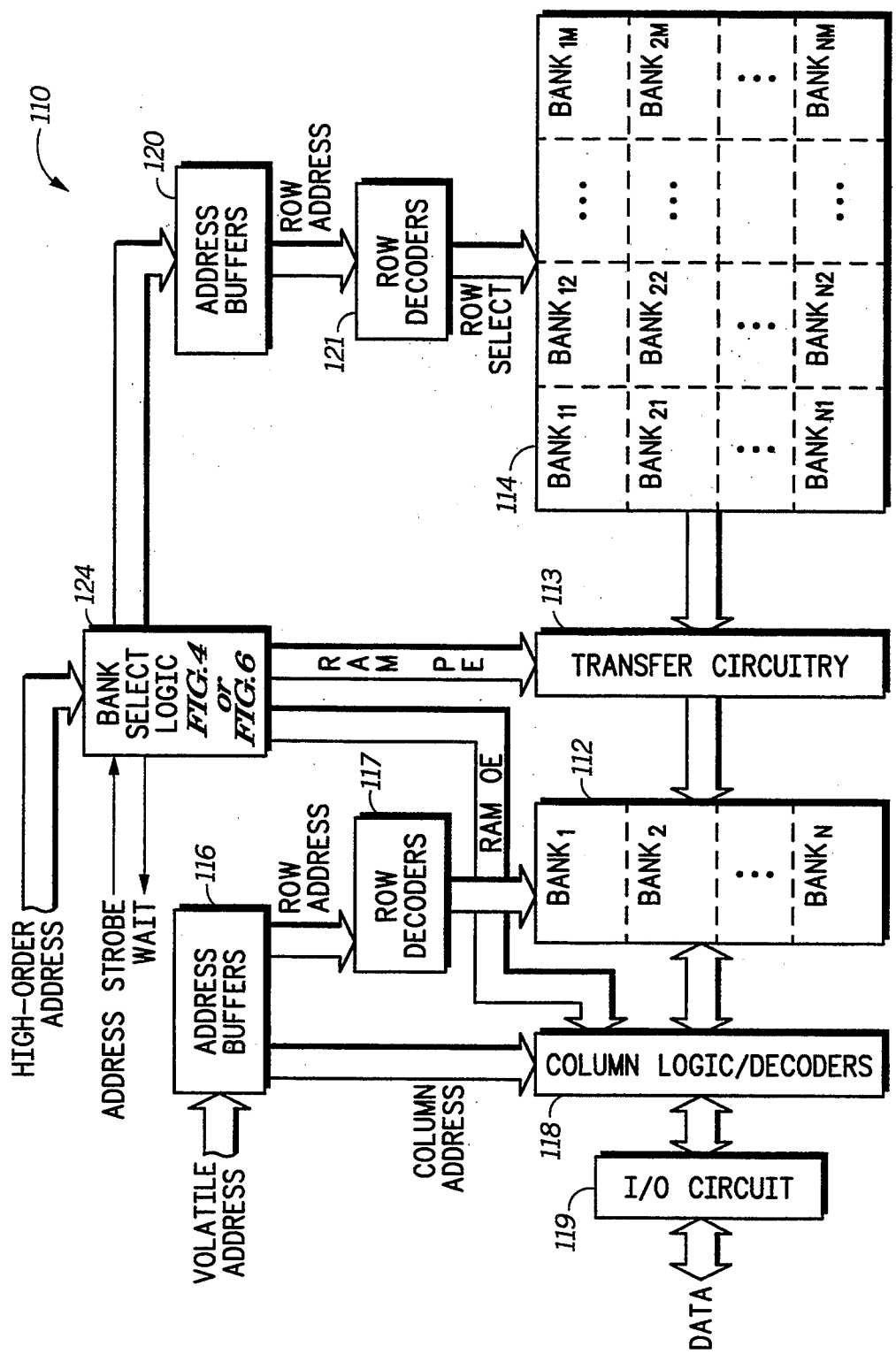
FIG. 3 illustrates in block diagram form a memory in accordance with another embodiment of the present invention.

FIG. 3 illustrates in block diagram form memory 110 in accordance with another embodiment of the present invention. In this embodiment, volatile memory array 112 includes a plurality of SRAM cells arranged as a plurality of banks of SRAM cells labeled "BANK$_1$", "BANK$_2$", and "BANK$_N$". SRAM cells are located at intersections of word lines and bit line pairs. Volatile memory address signals labeled "VOLATILE ADDRESS" are provided to address buffers 116 and to bank select logic circuit 124. Volatile memory row address signals labeled "ROW ADDRESS" are provided to row decoders 117 and volatile memory column address signals labeled "COLUMN ADDRESS" are provided to column logic/decoders 118. Row decoders 117 are coupled to the word lines of volatile memory array 112, and column logic/decoders 118 is coupled to the bit line pairs of volatile memory array 112. Column logic/decoder 118 is coupled to each bit line pair of volatile memory array 112.

Nonvolatile memory array 114 includes a plurality of memory cells arranged as a plurality of banks of memory cells, labeled "BANK$_{11}$" through "BANK$_{NM}$". Memory cells are located at intersections of word lines and single-ended bit lines. Address buffers 120 receive address signals from bank select logic circuit 124. The particular address signals received depends on which bank select logic circuit is used. Bank select logic circuit 124 (FIG. 4) and bank select logic circuit 124' (FIG. 6) are alternate embodiments, and will be discussed later. Address buffers 120 provide address signals labeled "ROW ADDRESS" to row decoders 121. Row decoders 121 provide row select signals labeled "ROW SELECT" to the word lines of nonvolatile memory array 114.

In a preferred embodiment, nonvolatile memory array 114 is not directly accessible by the processor. Data stored in nonvolatile memory array 114 may be accessed by the processor after it is transferred into volatile memory array 112. This transfer operation, from nonvolatile memory array 114 to volatile memory array 112, may be controlled by the processor, or accomplished as a background transfer invisibly to the processor. Also, the processor can access volatile memory array 112 directly for normal read/write operations at fast SRAM rates. Allowing write cycles to volatile memory array 112 provides flexibility to the processor to update data or instructions as needed. Note that, whether the information is actually instructions or data, the information may be referred to as simply data.

During a write cycle of memory 110, volatile memory array 112 may be accessed in the same manner as a conventional random access memory. Input data labeled "DATA" is received by column logic/decoders 118 through input/output circuit 119. During a read cycle, DATA is provided by column logic/decoders 118 to input/output circuit 119. A single bank of volatile memory array 112 contains the same number of bits as a single bank of nonvolatile memory array 114. However, there may be any number of banks in nonvolatile memory array 114 and volatile memory array 112, depending on the size of the memory, and the application. For example, if nonvolatile memory array 114 is a 2 megabit by 16 bit ROM, it can be divided into various bank sizes. If the ROM is divided into 2 kilobit banks, there are 1024 banks. Volatile memory array 112 may therefore have any number of 2 kilobit banks of volatile memory. The requirements of the particular application would determine how many banks of memory cells in volatile memory array 112 would be required.

During normal operations, a processor may access volatile memory array 112 for instructions and data. Address signals HIGH ORDER ADDRESS are used by bank select logic circuit 124 to identify the contents of each bank of volatile memory array 112. If the address location of the data or instructions needed by the processor is located in volatile memory array 112, bank select logic circuit 124 provides an output enable signal labeled "RAM OE" to column logic/decoders 118 and a normal access occurs. If the data or instructions needed by the processor are not located in volatile memory array 112, a "space fault" occurs, and bank select logic circuit 124 provides a preload enable signal labeled "RAM PE" to transfer circuitry 113 to transfer the required bank of nonvolatile memory array 114 to volatile memory array 112. Bank select logic circuit 124 also provides address signals HIGH ORDER ADDRESS to address buffers 120 to identify which bank of nonvolatile memory array 114 is to be transferred to volatile memory array 112. There is an output enable signal RAM OE and a preload enable signal RAM PE corresponding to each bank of volatile memory array 112. While a transfer is in progress, bank select logic circuit 124 provides a signal labeled "WAIT" to the processor to prevent accesses of volatile memory array 112 until the transfer is complete. Transfer circuitry 113 couples the single ended bit lines of nonvolatile memory array 114 to the bit line pairs of volatile memory array 112, and is similar to the circuitry of transfer circuit 82 shown in FIG. 2. Embodiments of bank select logic circuit 124 are provided in FIG. 4 and in FIG. 6, and will be discussed below.

Volatile memory address signals VOLATILE ADDRESS may be provided externally to memory 20 for direct access to volatile memory array 22 for standard read/write operations, or may be internally generated as a destination address in conjunction with the nonvolatile high order address when a transfer from nonvolatile memory array 32 to volatile memory array 22 is required. Alternately, an external volatile memory address may be supplied by the user to define which bank of volatile memory array 22 is to receive data from nonvolatile memory array 32.

Figure 4:
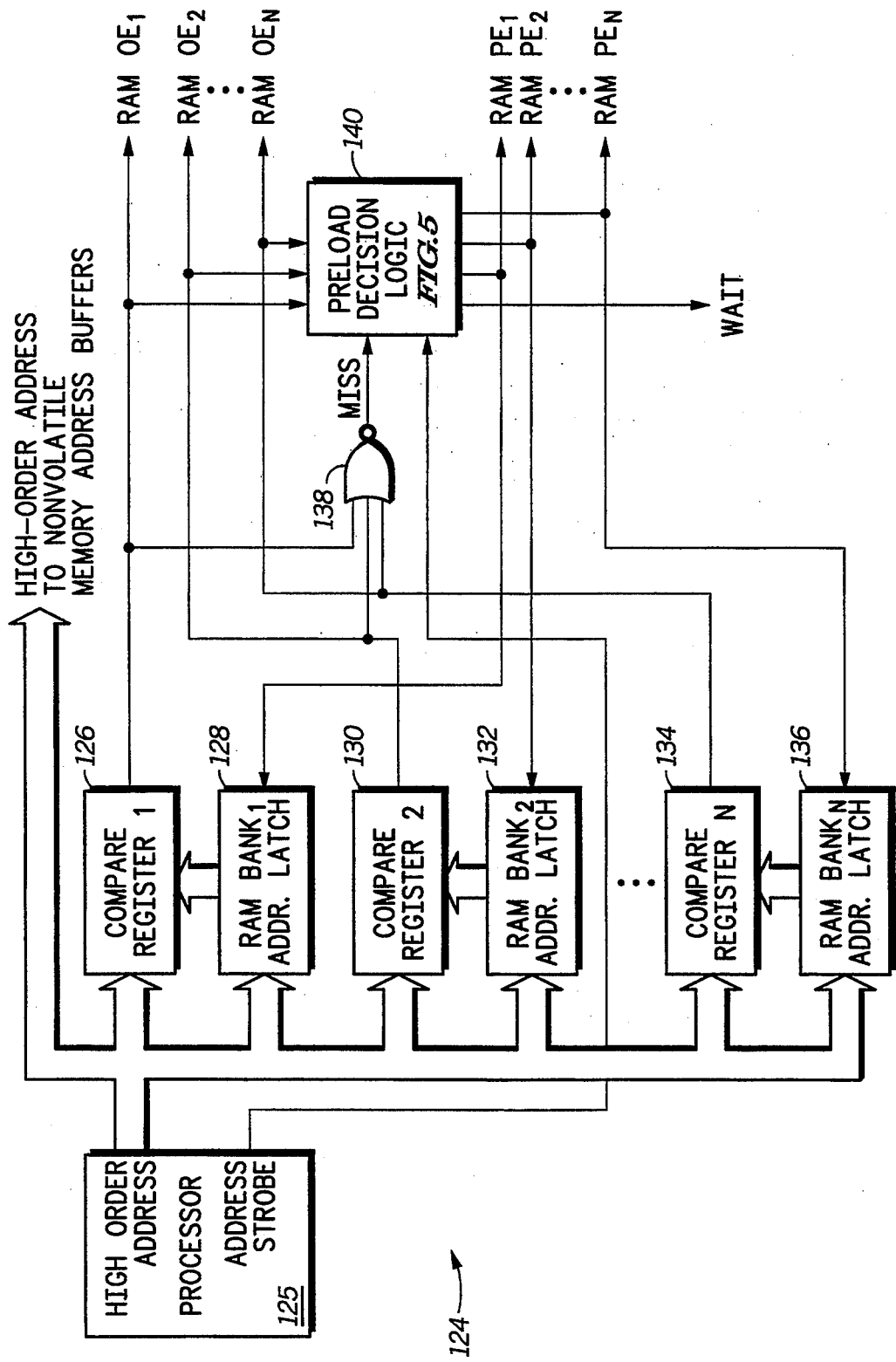
FIG. 4 illustrates in partial logic diagram form and partial block diagram form one embodiment of the bank select logic circuit of FIG. 3.

FIG. 4 illustrates in partial logic diagram form and partial block diagram form one embodiment of bank select logic circuit 124 of FIG. 3. A data processor 125 is also shown in FIG. 4. Bank select logic circuit 124 includes compare registers 126, 130, and 134, address latches 128, 132, and 136, NOR gate 138, a and preload decision logic 140. Compare register 126 has a first plurality of input terminals for receiving high order address signals labeled "HIGH ORDER ADDRESS" from processor 125, a second plurality of input terminals coupled to address latch 128, and an output terminal for providing an output enable signal labeled "RAM $OE_1$". Compare register 130 has a first plurality of input terminals for receiving high order address signals HIGH ORDER ADDRESS from processor 125, a second plurality of input terminals coupled to address latch 132, and an output terminal for providing an output enable signal labeled "RAM $OE_2$". Compare register 134 has a first plurality of input terminals for receiving high order address signals HIGH ORDER ADDRESS from processor 125, a second plurality of input terminals coupled to address latch 136, and an output terminal for providing an output enable signal labeled "RAM $OE_N$". Address latch 128 has a first plurality of input terminals for receiving address signals HIGH ORDER ADDRESS, a first plurality of output terminals coupled to compare register 126, and a second input terminal for receiving a preload enable signal labeled "RAM $PE_1$". Address latch 132 has a first plurality of input terminals for receiving address signals HIGH ORDER ADDRESS, a first plurality of output terminals coupled to compare register 130, and a second input terminal for receiving a preload enable signal labeled "RAM $PE_2$". Address latch 136 has a first plurality of input terminals for receiving address signals HIGH ORDER ADDRESS, a first plurality of output terminals coupled to compare register 134, and a second input terminal for receiving a preload enable signal labeled "RAM $PE_N$". Note that there is a compare register and address latch for each bank of volatile memory array 112. For example, if volatile memory array 112 is divided into four banks, there would be four address latches and four compare registers, that is, an address latch and compare register for each bank. The high-order address signals are used to determine which bank of volatile memory array 112 receives data from nonvolatile memory array 114 of FIG. 3. The high-order address is stored in each of address latches 128, 132, and 136 to identify the data stored in each of the banks of volatile memory array 112. Note that volatile memory array 112 may be divided into two or more banks. In a preferred embodiment, volatile memory array 112 is divided into four banks.

NOR gate 138 has a first input terminal coupled to the output terminal of compare register 126 for receiving output enable signal RAM $OE_1$, a second input terminal coupled to the output terminal of compare register 130 for receiving output enable signal RAM $OE_2$, a third input terminal coupled to the output terminal of compare register 134 for receiving output enable signals RAM $OE_N$, and an output terminal coupled to preload decision logic circuit 140 for providing a signal labeled "MISS". Signal MISS is provided when bank select logic circuit 124 receives the address signals HIGH ORDER ADDRESS for a bank of nonvolatile memory array 114 that is not currently loaded in any of the banks of volatile memory array 112. Preload decision logic circuit 140 has first, second, and third input terminals for receiving output enable signals RAM OE$_1$, RAM OE$_2$, and RAM OE$_N$, respectively. Preload decision logic circuit 140 also has first, second, and third output terminals for providing preload enable signals RAM PE$_1$, RAM PE$_2$, and RAM PE$_N$, respectively, and a fourth output terminal for providing a signal labeled "WAIT" to processor 125, and a fourth input terminal for receiving an address strobe signal labeled "ADDRESS STROBE". An address strobe is a timing signal that indicates the validity of an address. Processor 125 also provides address signals HIGH ORDER ADDRESS to nonvolatile memory array 114 of FIG. 3. Note that logic gate 138, as well as other logic gates, represents a logic operation rather than a single logic gate.

Address latches 128, 132, and 136 latch the address of the data stored in volatile banks BANK$_1$, BANK$_2$, and BANK$_N$, respectively. Compare registers 126, 130, and 134 each receives address signals HIGH ORDER ADDRESS for data or instructions requested by processor 125, and compares them to the addresses stored by address latches 128, 132, and 136. If a match is detected by one of the compare registers, the compare register provides a logic high output enable signal to enable the corresponding bank of volatile memory array 112 for a normal access. If none of compare registers 126, 130, or 134 indicates a match, a "space fault" occurs. A typical way for a space fault to occur is when there is a switch between instruction and data spaces in a program or routine. There may be more than one data space utilized within a routine, and switches between those, if they are relatively widely separated, may also cause space faults. In the case of a space fault, all of the output enable signals RAM OE$_1$ through RAM OE$_N$ are logic low signals causing NOR gate 138 to provide logic high signal MISS to preload decision logic circuit 140. Preload decision logic 140 selects a bank of volatile memory array 112 to receive new data from a bank of nonvolatile memory array 114. A preload enable signal is activated for the appropriate bank of volatile memory array 114, and an address latch also receives the preload enable signal to identify which bank of volatile memory array 112 is to receive new data. Address buffers 120 of nonvolatile memory array 114 receives the address of the nonvolatile memory locations to be loaded into volatile array 112. While a transfer operation is in progress, preload decision logic 140 provides signal WAIT to the processor or bus logic to delay the bus cycle until the transfer is complete. The transfer from nonvolatile memory array 114 to volatile memory array 112 may be controlled by processor 125 or accomplished invisibly to processor 125. Compare registers 126, 130, and 134 are conventional comparator circuits for comparing two logic signals. Compare registers 126, 130, and 134 provide a logic high signal as a result of detecting a match.

Preload decision logic 140 determines which bank of volatile memory array 112 to load with data from nonvolatile memory array 114. Any appropriate algorithm may be used to decide which bank of volatile memory array 112 is to be loaded with new data from nonvolatile memory array 114. In the preferred embodiment, a least-recently-used algorithm is used, where the bank of volatile memory array 112 which has been idle for the longest time is selected. Preload decision logic circuit 140 will be discussed below in more detail in connection with FIG. 5.

Figure 5:
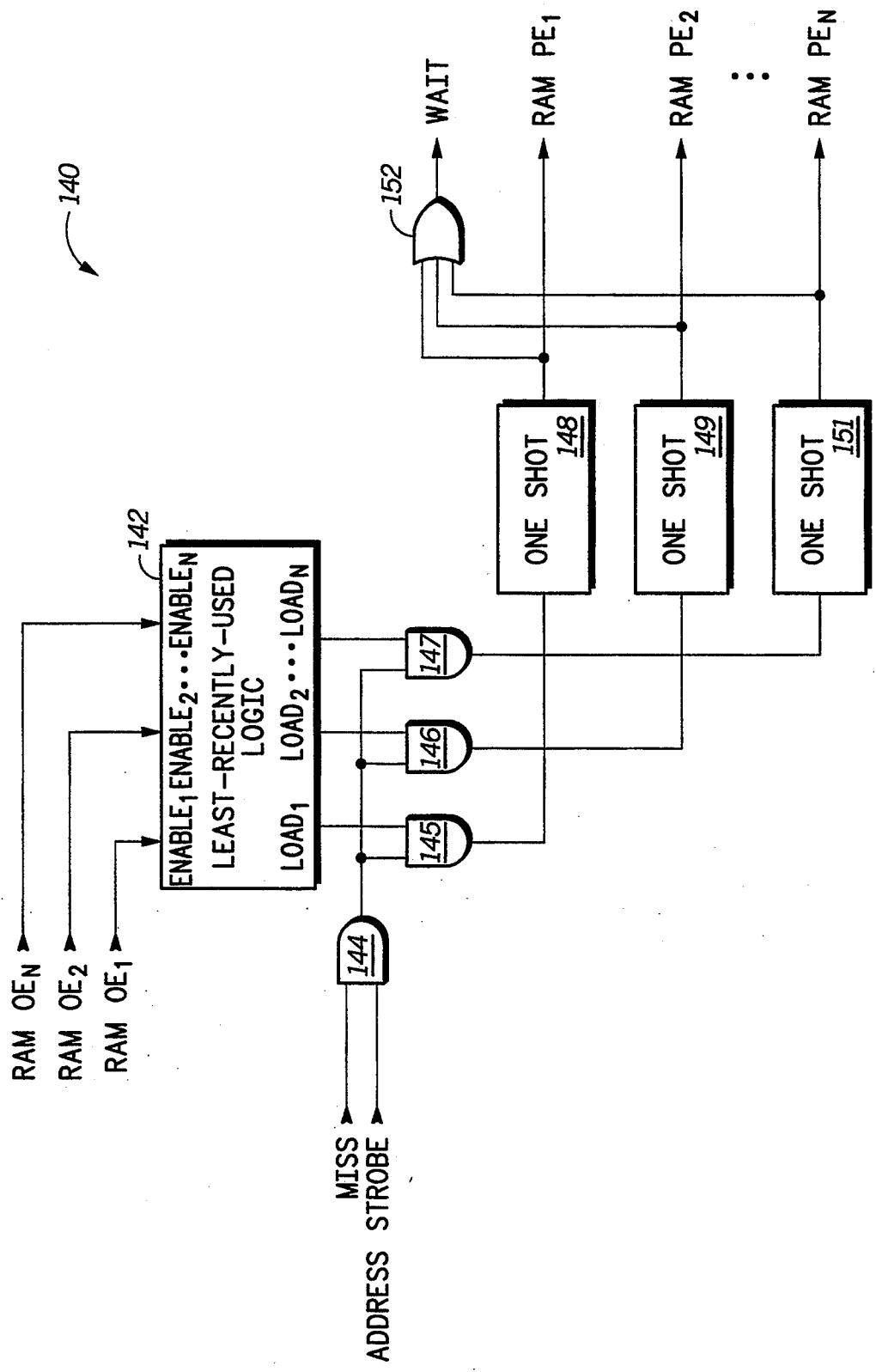
FIG. 5 illustrates in partial block diagram form and partial logic diagram form the preload decision logic circuit of FIG. 4.

FIG. 5 illustrates in partial block diagram form and partial logic diagram form preload decision logic circuit 140 of FIG. 4. Preload decision logic circuit 140 includes least-recently-used (LRU) logic circuit 142, AND gates 144, 145, 146, and 147, one shot circuits 148, 149, and 151, and OR gate 152. LRU logic circuit 142 has a plurality of input terminals labeled "ENABLE$_1$", "ENABLE$_2$", and "ENABLE$_N$", and a plurality of output terminals labeled "LOAD$_1$", "ENABLE$_2$", and "LOAD$_N$". LRU logic circuit 142 receives RAM output enable signals RAM OE$_1$ through RAM OE$_N$ from compare registers 126, 130, and 136, determines which bank of volatile memory array 112 has been idle for the longest time, and provides a logic high signal at the output terminal corresponding to the least-recently-used bank. AND gate 144 has a first input terminal for receiving signal MISS, a second input terminal for receiving address strobe signal ADDRESS STROBE, and an output terminal. AND gate 145 has a first input terminal connected to the output terminal of AND gate 144, a second input terminal for receiving load signal LOAD$_1$, and an output terminal. AND gate 146 has a first input terminal connected to the output terminal of AND gate 144, a second input terminal for receiving load signal LOAD$_2$, and an output terminal. AND gate 147 has a first input terminal connected to the output terminal of AND gate 144, a second input terminal for receiving load signal LOAD$_N$, and an output terminal. One shot circuit 148 has an input terminal connected to the output terminal of AND gate 145, and an output terminal for providing preload enable signal RAM PE$_1$. One shot circuit 149 has an input terminal connected to the output terminal of AND gate 146, and an output terminal for providing preload enable signal RAM PE$_2$. One shot circuit 151 has an input terminal connected to the output terminal of AND gate 147, and an output terminal for providing preload enable signal RAM PE$_N$. OR gate 152 has input terminals for receiving each of preload enable signals RAM PE$_1$, RAM PE$_2$, and RAM PE$_N$, and an output terminal for providing a signal labeled "WAIT" to processor 125, or alternately, to a bus controller.

In operation, LRU logic circuit 142 receives RAM output enable signals from compare registers 126, 130, and 134 in order for LRU logic circuit 142 to keep track of the least-recently-used bank of volatile memory array 112. LRU logic circuit 142 uses a conventional least-recently-used algorithm similar to those used with cache memory. By way of example, a least-recently-used block for a cache memory is taught in U.S. Pat. No. 4,996,641, entitled "Diagnostic Mode For A Cache", issued to Talgam et al. on Feb. 26, 1991, and in U.S. Pat. No. 4,168,541, entitled "Paired Least Recently Used Block Replacement System", issued to DeKarske on Sep. 18, 1979.

When a transfer from nonvolatile memory array 114 to volatile memory array 112 is necessary, signal MISS from NOR gate 138 (FIG. 4) is received at the first input of AND gate 144, indicating that a space fault has occurred. LRU logic circuit 142 provides one of load signals LOAD$_1$, LOAD$_2$, or LOAD$_N$, corresponding to the least-recently-used bank, BANK$_1$, BANK$_2$, or BANK$_N$, respectively. If the address is valid, address strobe signal ADDRESS STROBE, is a logic high as well. When both input terminals of AND gate 144 are at a logic high, AND gate 144 provides a logic high to the first input terminals of AND gates 145, 146, and 147. One of AND gates 145, 146, or 147 will then provide a logic high output signal, depending on which of signals LOAD$_1$, LOAD$_2$, or LOAD$_N$ is a logic high. When one of one shot circuits 148, 149, or 151 receives a logic high signal at its input terminal, a logic high preload enable signal is provided at its output terminal. The preload enable signal is of sufficient duration to complete a transfer operation. In addition, the logic high preload enable signal from one shot circuit 148, 149, or 151 is provided to OR gate 152. The logic high output of OR gate 152 is provided to processor 125 (FIG. 4) to prevent processor 125 from attempting to access volatile memory array 112 while a transfer operation is in progress. In the preferred embodiment, one shot circuits are used to provide the preload enable signals. However, in other embodiments, other types of timing circuits may be used for this purpose.

Figure 6:
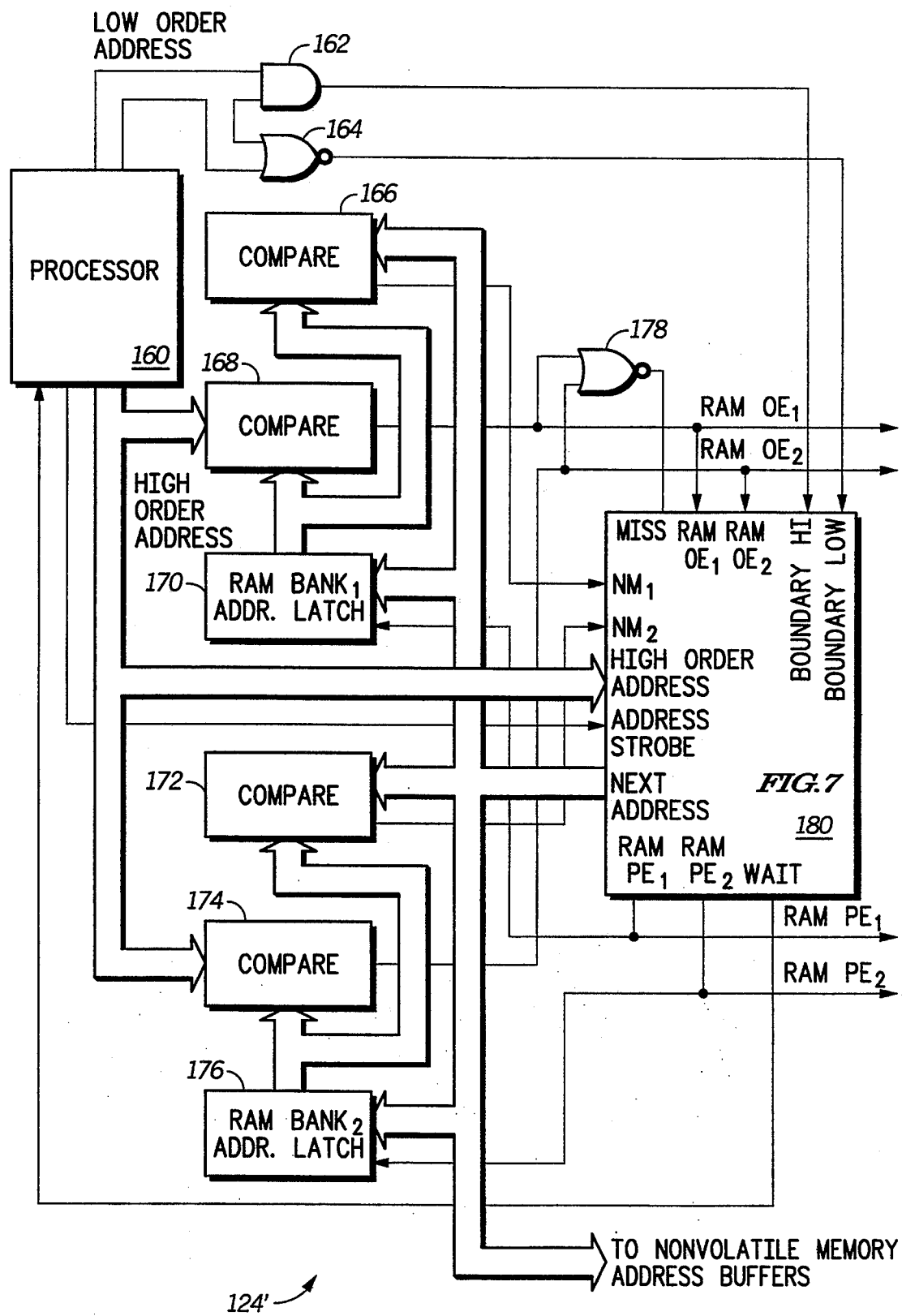
FIG. 6 illustrates in partial block diagram form and partial logic diagram form another embodiment of the bank select logic circuit of FIG. 3.

FIG. 6 illustrates in partial block diagram form and partial logic diagram form bank select logic circuit 124' as a second embodiment of bank select logic circuit 124 of FIG. 3. Bank select logic circuit 124' includes AND gate 162, NOR gate 164, compare registers 166, 168, 172, and 174, address latches 170 and 176, NOR gate 178, and preload decision logic circuit 180. Also shown in FIG. 6 is a data processor 160.

AND gate 162 has a plurality of input terminals for receiving low order address signals labeled "LOW ORDER ADDRESS" from processor 160, and an output terminal for providing an output signal labeled "BOUNDARY HI". NOR gate 164 has a plurality of input terminals for receiving low order address signals from processor 160, and an output terminal for providing an output signal labeled "BOUNDARY LOW". Compare register 166 has a plurality of first input terminals for receiving latched address signals from address latch 170, a plurality of second input terminals for receiving a plurality of address signals labeled "NEXT ADDRESS" from preload decision logic circuit 180, and an output terminal for providing a no match signal labeled "NM$_1$". Compare register 172 has a plurality of first input terminals for receiving latched address signals from address latch 176, a plurality of second input terminals for receiving a plurality of address signals labeled "NEXT ADDRESS" from preload decision logic circuit 180, and an output terminal for providing a no match signal labeled "NM$_2$". Compare register 168 has a first plurality of input terminals for receiving latched address signals from address latch 170, a second plurality of input terminals for receiving high order address signals from processor 160, and an output terminal for providing RAM output enable signal RAM OE$_1$. Compare register 174 has a first plurality of input terminals for receiving latched address signals from address latch 176, a second plurality of input terminals for receiving high order address signals from processor 160, and an output terminal for providing RAM output enable signal RAM OE$_2$. Address latch 170 has a plurality of input terminals for receiving address signals NEXT ADDRESS from preload decision logic circuit 180, and a second input terminal for receiving RAM preload enable signal RAM PE$_1$, and a plurality of output terminals for providing latched address signals. Address latch 176 has a plurality of input terminals for receiving address signals NEXT ADDRESS from preload decision logic circuit 180, and a second input terminal for receiving RAM preload enable signal RAM PE$_2$, and a plurality of output terminals for providing latched address signals. NOR gate 178 has a first input terminal for receiving RAM output enable signal RAM OE$_1$, a second input terminal for receiving RAM output enable signal RAM OE$_2$, and an output terminal for providing miss signal MISS to preload decision logic circuit 180.

In a data processing system the movement through a program is usually sequential, or follows some other predictable pattern. Bank select logic circuit 124' monitors this movement through the program and attempts to predict when adjacent banks of nonvolatile memory are going to be accessed. Bank select logic circuit 124' then preloads a currently unused bank of volatile memory array 112 with an adjacent bank of nonvolatile memory array 114 invisibly to the processor, having the data available in volatile memory array 112 when it is required, to avoid a space fault. In the preferred embodiment, preload decision logic 180 chooses the bank of volatile memory array 112 that has not been accessed for the longest period of time. In other embodiments, other methods may be used to determine which bank of volatile memory array 112 to preload. However, if a space fault occurs, bank select logic circuit 124' performs a transfer to the least-recently-used bank of RAM in a manner similar to bank select logic circuit 124 of FIG. 4. Note that bank select logic circuit 124' is illustrated in FIG. 6 for a volatile memory array 112 subdivided into two banks of memory cells. A two bank implementation for bank select logic circuit 124' is illustrated for clarity. The principles may be easily extended for more than two banks, and in the preferred embodiment volatile memory array 112 is divided into four banks.

In normal operation, processor 160 provides high order address signals HIGH ORDER ADDRESS to compare registers 168, 174, and preload decision logic circuit 180. Compare registers are conventional comparator circuits and compare the high order address from processor 160 to the address stored in address latches 170 and 176. Each of address latches 170 and 176 store the high order addresses for the data that is currently loaded into one bank of volatile memory array 112. If either of compare registers 168 or 174 detect a match, a corresponding one of output enable signals RAM OE$_1$ or RAM OE$_2$ is provided as a logic high to column logic/decoders 118, and a normal read/write access to volatile memory array 112 occurs. However, if neither of compare registers 168 or 174 detects a match, both of output enable signals RAM OE$_1$ and RAM OE$_2$ will be provided as logic low signals indicating that a space fault has occurred. NOR gate 178 will then provide a logic high miss signal MISS to preload decision logic circuit 180, which will cause a transfer of data from nonvolatile memory array 114 to volatile memory array 112. While a transfer operation is in progress, preload decision logic 180 also sends a wait signal to processor 160 to delay the bus cycle until the transfer is complete. A transfer from nonvolatile memory array 114 to volatile memory array 112 takes about 100–400 nanoseconds to complete, depending on the size of a bank of volatile memory array 112.

Preload decision logic 180 also attempts to preload the next bank of volatile memory array 112 before a space fault can occur. Each bank of volatile memory array 112 has an upper address boundary and a lower address boundary. As processor 160 moves sequentially through the program, it will move close to either the upper or lower boundary address. Preload decision logic 180 monitors the movement through the program and at a predetermined distance from either the upper or lower boundary address, it preloads the next bank of nonvolatile memory array 114 into the least-recently-used bank of volatile memory array 112 in anticipation that processor 160 will need to access the next bank in sequence. The lower-order address bits are used to determine when to perform this background preload operation. The background preload operation is done in the background, i.e., invisibly to processor 160, so that processor 160 finds the next bank accessible in volatile memory array 112 when needed, thus avoiding a space fault, and a subsequent delay while the next bank is being preloaded.

The preload decision is made far enough in advance so that the background preload is complete before processor 160 accesses the next bank. The preload decision is based on the ratio of access times between nonvolatile memory array 114 and volatile memory array 112, so that if X number of RAM accesses are possible in the time it takes to perform the transfer, the preload decision is set to the lowest power of 2 which is greater than or equal to X. If processor 160 is sequentially incrementing the addresses, AND gate 162 provides logic signal BOUNDARY HI to preload decision logic circuit 180 to preload the next higher bank of nonvolatile memory array 114 into volatile memory array 112 when the boundary of the presently accessed bank of volatile memory array 112 is imminent. If processor 160 is sequentially decrementing the addresses, NOR gate 164 provides logic signal BOUNDARY LOW to preload decision logic circuit 180 to preload the next lower bank of nonvolatile memory array 114 into volatile memory array 112 when the boundary of the presently accessed bank of volatile memory array 112 is imminent. For example, if the size of a bank of volatile memory array 112 is 1024 bits, and the preload decision is to be made eight addresses before a bank boundary is reached, then a detection of all one's in address lines 3–9 causes AND gate 162 to provide logic signal BOUNDARY HI as a logic high, causing the next higher bank of nonvolatile memory array 114 to be preloaded, and all zero's in those addresses causes NOR gate 164 to provide logic signal BOUNDARY LOW as a logic high signal which causes the next lower bank to be preloaded.

In order to perform a background preload from nonvolatile memory array 114 to volatile memory array 112, address signals HIGH ORDER ADDRESS are provided to preload decision logic 180, and in response, preload decision logic 180 provides address signals NEXT ADDRESS to address latches 170 and 176 and to compare registers 166 and 172. Compare register 166 is a conventional comparator, and compares the contents of address latch 170 to address signal NEXT ADDRESS. Likewise, compare register 172 compares the contents of address latch 176 to address signal NEXT ADDRESS. If either or both of compare registers 166 and 172 detect a match between address NEXT ADDRESS and the bank address that is latched in address latches 170 and 176, then a logic high signal is provided to preload decision logic 180 indicating that a background preload is not yet needed. If neither of compare registers 166 or 172 detect a match, then logic high signals $NM_1$ and $NM_2$ are provided to preload decision logic 180.

In a manner similar to that used by bank select logic circuit 124 of FIG. 4, compare registers 168 and 174 receive the high-order address signals HIGH ORDER ADDRESS and compares the higher-order address to the high-order address stored by address latches 170 and 176, respectively. If a match is detected by one of compare registers 168 or 174, the address that processor 160 is attempting to access is located in volatile memory array 112. The compare register that detected the match provides a logic high output enable signal RAM $OE_1$ or RAM $OE_2$, depending on which of compare registers 168 or 174 made the match, and a normal access occurs. If neither of compare registers 168 or 174 indicates a match, a space fault occurs, and the next bank of nonvolatile memory array 114 is transferred into volatile memory array 112. In the case of a space fault, NOR gate 178 provides signal MISS as a logic high to preload decision logic circuit 180. Preload decision logic 180 selects a bank of volatile memory array 112 to receive new data from a bank of nonvolatile memory array 114. A least-recently-used algorithm is used to determine which bank of volatile memory array 112 is to receive new data. A logic high preload enable signal RAM $PE_1$ or RAM $PE_2$ is provided to transfer circuitry 113 to initiate a transfer or preload. The preload enable signal is also provided to the appropriate address latch in order to identify the new data being loaded into that bank. Transfer circuitry 113 is similar to the transfer circuitry of transfer circuit 80 of FIG. 2. Address buffers 120 receive the addresses of the nonvolatile memory locations to be loaded into volatile memory array 112. While a transfer operation is in progress, preload decision logic 180 also sends a wait signal WAIT to processor 160 to delay the bus cycle until the transfer is complete. A transfer from nonvolatile memory array 114 to volatile memory array 112 may be controlled by the processor or accomplished independently and invisibly to the processor.

Figure 7:
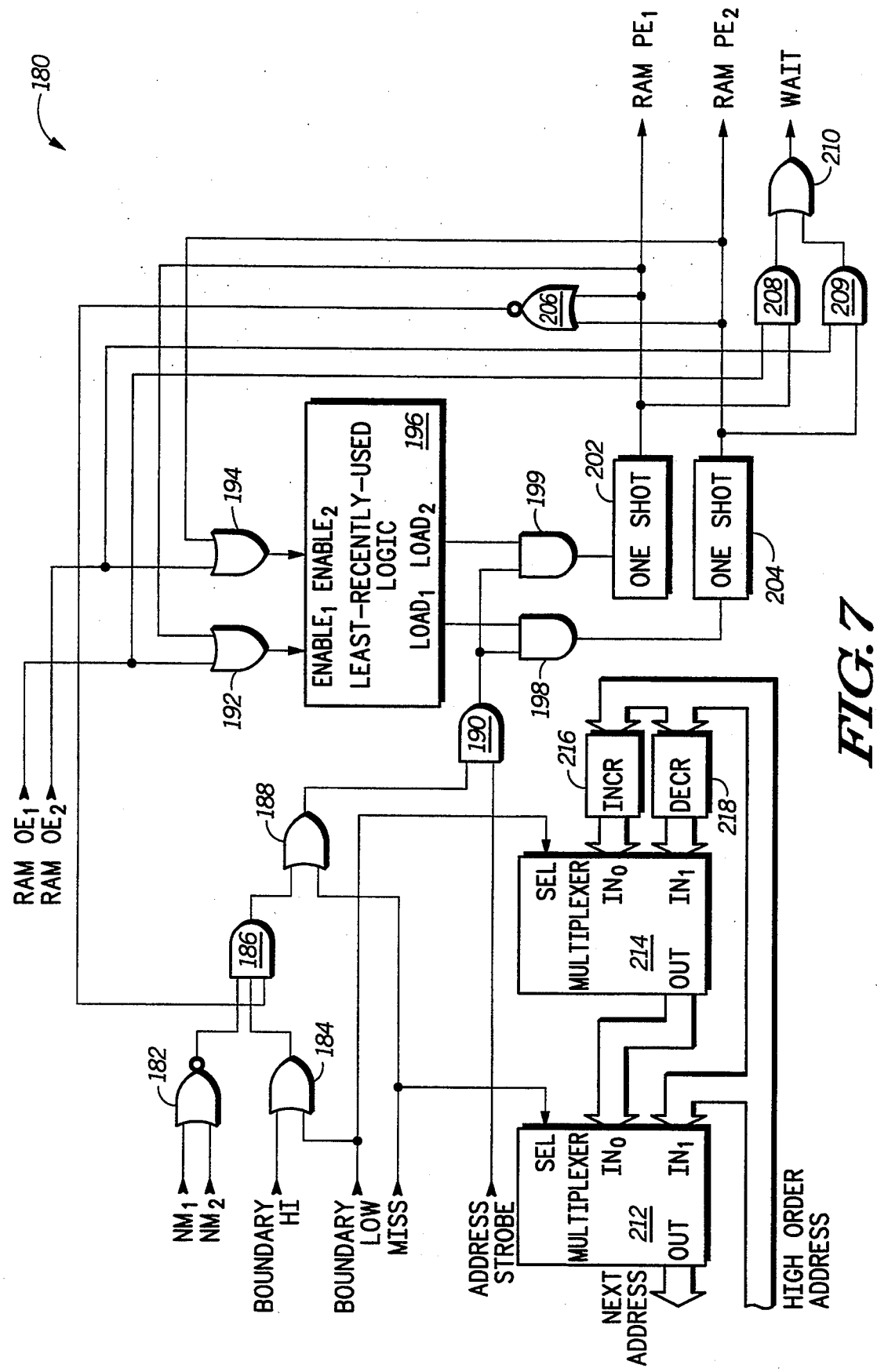
FIG. 7 illustrates in partial block diagram form and partial logic diagram form the preload decision logic circuit of FIG. 6.

FIG. 7 illustrates in partial block diagram form and partial logic diagram form preload decision logic circuit 180 of FIG. 6. Preload decision logic circuit 180 includes OR gates 184, 188, 192, 194, and 210, AND gates 186, 190, 198, 199, 208, and 209, NOR gates 182 and 206, LRU logic circuit 196, one shot circuits 202 and 204, multiplexers 212 and 214, increment circuit 216, and decrement circuit 218.

NOR gate 182 has a first input terminal for receiving next miss signal labeled "$NM_1$", and second input terminal for receiving a next miss signal labeled "$NM_2$", and an output terminal. OR gate 184 has a first input terminal for receiving logic signal BOUNDARY HI, a second input terminal for receiving logic signal BOUNDARY LOW, and an output terminal. AND gate 186 has a first input terminal connected to the output terminal of NOR gate 182, a second input terminal connected to the output terminal of OR gate 184, a third input terminal, and an output terminal. OR gate 188 has a first input terminal connected to the output terminal of AND gate 186, a second input terminal for receiving miss signal MISS, and an output terminal. AND gate 190 has a first input terminal connected to the output terminal of OR gate 188, a second input terminal for receiving address strobe signal ADDRESS STROBE, and an output terminal. OR gate 192 has a first input terminal for receiving output enable signal RAM $OE_1$, a second input terminal for receiving preload enable signal RAM $PE_1$, and an output terminal. OR gate 194 has a first input terminal for receiving output enable signal RAM $OE_2$, a second input terminal for receiving preload enable signal RAM $PE_2$, and an output terminal.

LRU logic circuit 196 has a first input terminal labeled "$ENABLE_1$" connected to the output terminal of OR gate 192, a second input terminal labeled "$ENABLE_2$" connected to the output terminal of OR gate 194, a first output terminal labeled "LOAD$_1$", and second output terminal labeled "LOAD$_2$". AND gate 198 has a first input terminal connected to the output terminal of AND gate 190, a second input terminal connected to the first output terminal of LRU logic circuit 196, and an output terminal. AND gate 199 has a first input terminal connected to the output terminal of AND gate 190, a second input terminal connected to the second output terminal of LRU logic circuit 196, and an output terminal. One shot circuit 202 has an input terminal connected to the output terminal of AND gate 199, and an output terminal for providing preload enable signal RAM PE$_1$. One shot circuit 204 has an input terminal connected to the output terminal of AND gate 198, and an output terminal for providing preload enable signal RAM PE$_2$. NOR gate 206 has a first input terminal connected to the output terminal of one shot circuit 202 for receiving preload enable signal RAM PE$_2$, a second input terminal connected to the output terminal of one shot circuit 202 for receiving preload enable signal RAM PE$_1$, and an output terminal connected to the third input terminal of AND gate 186. AND gate 208 has a first input terminal for receiving output enable signal RAM OE$_1$, a second input terminal connected to the output terminal of one shot circuit 202 for receiving preload enable signal RAM PE$_1$, and an output terminal. AND gate 209 has a first input terminal for receiving output enable signal RAM OE$_2$, a second input terminal connected to the output terminal of one shot circuit 204 for receiving preload enable signal RAM PE$_2$, and an output terminal. OR gate 210 has a first input terminal connected to the output terminal of AND gate 208, a second input terminal connected to the output terminal of AND gate 209, and an output terminal for providing wait signal WAIT to processor 160.

Multiplexer 212 has a first plurality of input terminals labeled "IN$_0$", a second plurality of input terminals labeled "IN$_1$" for receiving address signals HIGH ORDER ADDRESS, a selection terminal labeled "SEL" for receiving miss signal MISS, and a plurality of output terminals labeled "OUT". Multiplexer 214 has a first plurality of input terminals labeled "IN$_0$", a second plurality of input terminals labeled "IN$_1$", a selection terminal labeled "SEL" for receiving output signal BOUNDARY LOW, and a plurality of output terminals labeled "OUT" connected to the first plurality of input terminals of multiplexer 212. Increment circuit 216 has a plurality of input terminals for receiving address signals HIGH ORDER ADDRESS, and a plurality of output terminals connected to the first plurality of input terminals of multiplexer 214. Decrement circuit 218 has a plurality of input terminals for receiving address signals HIGH ORDER ADDRESS, and a plurality of output terminals connected to the second plurality of input terminals of multiplexer 214.

Preload decision logic 180 monitors the lower-order address signals from processor 160 (FIG. 6) to determine when a space fault is likely to occur and causes a background preload operation to prevent the space fault. However, if a space fault occurs, preload decision logic 180 uses a least-recently-used algorithm to transfer the contents of the appropriate bank of nonvolatile memory array 114 to volatile memory array 112.

Multiplexers 212 and 214 provide the address signals received by compare registers 166 and 172 and address latches 170 and 176 of FIG. 6. When logic signal BOUNDARY LOW is received at selection terminal SEL of multiplexer 214 as a logic low, input terminals IN$_0$ of multiplexer 214 receives address signals from increment logic 216, and provides them to output terminal OUT. When logic signal BOUNDARY LOW is a logic high, input terminals IN$_1$ receives address signals from decrement logic 218 and provides them to output terminal labeled OUT. A logic high miss signal MISS, indicating that a transfer operation is required, causes multiplexer 212 to receive address signals HIGH ORDER ADDRESS. If miss signal MISS is a logic low, input terminals IN$_0$ receive address signals from the output terminal of multiplexer 214. Increment logic 216 increments address signals HIGH ORDER ADDRESS by one bit. Decrement logic 218 decreases address signals HIGH ORDER ADDRESS by one bit. If signal MISS is a logic high, the numerical value of address signals NEXT ADDRESS is equal to the numerical value of address signals HIGH ORDER ADDRESS. If signal MISS is a logic low, then address signals NEXT ADDRESS are either equal to the numerical value of address signals HIGH ORDER ADDRESS incremented or decremented by one bit, depending on the logic state of signal BOUNDARY LOW.

LRU logic circuit 196 keeps track of the least-recently-used banks of volatile memory array 112 in the same manner as LRU logic circuit 142 of FIG. 5. A logic high miss signal MISS indicates that a space fault has occurred and that a bank of nonvolatile memory array 114 should be loaded into volatile memory array 112. If miss signal MISS is received by OR gate 188, and the address has been determined to be valid by a logic high address strobe signal ADDRESS STROBE, a logic high signal is provided to the first input terminal of AND gate 198 and 199. AND gate 198 or 199 will provide a logic signal depending on which of the output terminals of LRU logic circuit 196 is a logic high. As described for preload decision logic circuit 140 of FIG. 5, if a space fault occurs, one shot circuits 202 and 204 provides a logic high preload enable signal RAM PE$_2$ to preload a bank of nonvolatile memory array 114 to RAM bank BANK$_2$ of volatile memory array 112. AND gate 209 receives RAM preload enable signal RAM PE$_2$. RAM output enable signal RAM OE$_2$ is also provided to AND gate 209. AND gates 208 and 209 prevent logic high wait signal WAIT from preventing an access of volatile memory array 112 unless the background preload operation is occurring in the same bank that processor 160 is attempting to access. Each of one shot circuits 202 and 204 provides a logic high preload enable signal of sufficient duration to complete a background preload operation or a transfer operation.

In order for a background preload operation to occur, all three input signals to AND gate 186 are logic high signals. NOR gate 182 provides a logic high signal when both of logic signals NM$_1$ and NM$_2$ are logic low signals indicating that the adjacent bank of nonvolatile memory array 114 is not currently loaded into any of the banks of volatile memory array 112. Also, either or both of logic signals BOUNDARY HI and BOUNDARY LOW are logic high signals indicating that either the upper or lower boundary address of the currently accessed bank of volatile memory array 112 is at the predetermined distance. In addition, the output terminal of NOR gate 206 is a logic high indicating that a transfer operation or background preload operation is not currently in progress. When the three inputs of AND gate 186 receive logic high signals, then the output of AND gate 186 is a logic high. A logic high provided to one of the inputs of OR gate 188 causes a logic high to be provided to AND gate 190. LRU logic circuit 196 provides a logic high signal at either of output terminals LOAD$_1$ or LOAD$_2$, depending on which bank of volatile memory array 112 has been inactive the longest. The logic high output signal from the output terminal of AND gate 190 and a logic high from either of LRU logic circuit 196 output terminals LOAD$_1$ or LOAD$_2$ causes a background preload to occur invisibly to processor 160. Wait signal WAIT SIGNAL is not provided unless processor 160 attempts to access the bank of volatile memory array 112 currently being preloaded, as indicated by a logic high output enable signal RAM OE$_1$ or RAM OE$_2$ being provided to the first input terminal of AND gate 208 or 209.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. An integrated circuit memory, comprising:
   a nonvolatile memory array having a plurality of banks of nonvolatile memory cells, each nonvolatile memory cell coupled to a bit line and a word line;
   a volatile memory array having a plurality of volatile memory cells, each volatile memory cell coupled to a word line and a bit line pair, said volatile memory array having the same number of memory cells as a single bank of said plurality of banks of nonvolatile memory cells; and
   a transfer circuit, coupled to said nonvolatile memory array and to said volatile memory array, said transfer circuit receiving an address signal and selectively transferring data from a bank of said nonvolatile memory cell array to said volatile memory cell array.

2. The integrated circuit memory of claim 1, wherein said nonvolatile memory cells are read only memory cells.

3. The integrated circuit memory of claim 1, wherein said volatile memory cells are static random access memory cells.

4. The integrated circuit memory of claim 1, wherein said volatile memory cells are dynamic random access memory cells.

5. The integrated circuit memory of claim 1, wherein said transfer circuit comprises:
   a bank select logic circuit for receiving said address, and in response, if said address corresponds to a location in said volatile memory array, causing said volatile memory array to be accessed, and if said address does not correspond to a location in said volatile memory array, said bank select logic circuit causing data from a bank of said nonvolatile memory array to be transferred to said volatile memory array; and
   coupling means, coupled to said bank select logic circuit, said nonvolatile memory array, and to said volatile memory array, for coupling a bit line of said nonvolatile memory array to a bit line pair of said volatile memory array when data is to be transferred from a bank of said nonvolatile memory array to said volatile memory array.

6. The integrated circuit memory of claim 5, wherein said coupling means comprises:
   precharge means, coupled to said bit lines and to said bit line pairs, for precharging said bit lines and said bit line pairs to a predetermined voltage in response to receiving a precharge control signal;
   an amplifier, coupled to each of said bit line pairs, responsive to an enable signal and to said predetermined voltage, said amplifier for setting said bit line pairs to a predetermined logic state; and
   a pass transistor for coupling a bit line of said nonvolatile memory array to a bit line pair of said volatile memory array in response to receiving a data transfer control signal from said bank select logic circuit.

7. The integrated circuit memory of claim 1, wherein said volatile memory array is characterized as having a read cycle and a write cycle.

8. An integrated circuit memory, comprising:
   a nonvolatile memory array having a plurality of banks of nonvolatile memory cells, each nonvolatile memory cell for storing a bit of binary data;
   a volatile memory array having a plurality of banks of volatile memory cells, each volatile memory cell for storing a bit of binary data, a bank of said volatile memory cells have the same number of cells as a bank of said nonvolatile memory cells, said plurality of banks of volatile memory cells being fewer in number than said plurality of banks of said nonvolatile memory cells; and
   a bank select logic circuit for receiving an address, and in response, if said address corresponds to data loaded in said volatile memory array, causing said volatile memory array to be accessed, and if said address does not correspond to data loaded in said volatile memory array, said bank select logic circuit causing data from a bank of said nonvolatile memory array to be transferred to said volatile memory array.

9. The integrated circuit memory of claim 8, wherein said nonvolatile memory cells are read only memory cells, and said volatile memory cells are static random access memory cells.

10. The integrated circuit memory of claim 8, wherein said nonvolatile memory cells are read only memory cells, and said volatile memory cells are dynamic random access memory cells.

11. The integrated circuit memory of claim 8, wherein said bank select logic circuit comprises:
   a plurality of address latches, each address latch of said plurality of address latches coupled to each bank of said plurality of banks of said volatile memory array, each address latch for storing a bank address, said bank address for identifying data stored in a bank of said volatile memory array;
   comparator means, coupled to each of said address latches, for comparing said bank address to said address and in response, if a match is detected, said comparator means providing an output enable signal in a first logic state, and if a match is not detected, said comparator means providing said output enable signal in a second logic state;
   logic means, coupled to each of said comparator means, said logic circuit providing a miss signal if all of said output enable signals are in said second logic state; and a preload decision logic circuit, coupled to said comparator means and to said logic means, said preload decision logic circuit causing data from a bank of said nonvolatile memory array to be transferred to a bank of said plurality of banks of said volatile memory array in response to receiving said miss signal and said output enable signal in said second logic state.

12. The integrated circuit memory of claim 11, wherein said logic means comprises a NOR logic operation having an input terminal coupled to each of said comparator means, and an output terminal coupled to said preload decision logic circuit for providing said miss signal.

13. The integrated circuit memory of claim 11, wherein said preload decision logic circuit further comprises:
a first logic circuit having a plurality of input terminals for receiving said output enable signals from said comparator means, and a plurality of output terminals, each output terminal for providing a load signal, said first logic circuit for selecting a bank of said plurality of banks of volatile memory cells to receive data from said plurality of banks of nonvolatile memory cells;
a plurality of timing circuits, each timing circuit having an input terminal coupled to an output terminal of said first logic circuit, and an output terminal for providing a preload enable signal that is of sufficient duration for a transfer of data from a bank of said nonvolatile memory array to a bank of said volatile memory array to occur; and
a second logic circuit having a plurality of input terminals, each input terminal coupled to said output terminal of each of said one shot circuits, and an output terminal for providing a wait signal, said wait signal for preventing said bank of said volatile memory array from being accessed until said transfer is complete.

14. The integrated circuit memory of claim 13, wherein said first logic circuit uses a least-recently-used algorithm for selecting which bank of said plurality of banks of said volatile memory array is to receive data.

15. The integrated circuit memory of claim 13, wherein said second logic circuit performs a logic OR operation.

16. An integrated circuit memory in a data processing system, comprising:
a nonvolatile memory array having a plurality of banks of ROM cells, each ROM cell for storing a bit of binary data;
a volatile memory array having a plurality of banks of volatile memory cells, each bank of volatile memory cells having an upper boundary address and a lower boundary address, and each volatile memory cell for storing a bit of binary data, wherein a bank of volatile memory cells has the same number of cells as a bank of nonvolatile memory cells, said plurality of banks of volatile memory cells being fewer in number than said plurality of banks of nonvolatile memory cells;
a bank select logic circuit, coupled to said volatile memory array and to said nonvolatile memory array, said bank select logic circuit receiving a first address, and in response, if said first address corresponds to a location in said volatile memory array, causing a bank of said volatile memory array to be accessed by a processor, and if said first address does not correspond to a location in said volatile memory array, said bank select logic circuit causing data from a bank of said nonvolatile memory array to be transferred to a bank of said volatile memory array; and wherein said bank select logic circuit comprises a preload decision logic circuit for determining whether said first address is within a predetermined distance of one of said upper boundary address or said lower boundary address and if so, preloading data from a bank of said nonvolatile memory array to a bank of said volatile memory array.

17. The integrated circuit memory of claim 16, wherein said bank select logic circuit comprises:
a plurality of address latches, each address latch of said plurality of address latches coupled to each bank of said plurality of banks of said volatile memory array, each address latch for storing a bank address, said bank address for identifying data stored in said bank of said volatile memory array;
first comparator means, coupled to each of said address latches, said first comparator means comparing said bank address to said first address and in response, if a match is detected, providing an output enable signal in a first logic state, and if a match is not detected, providing said output enable signal in a second logic state;
logic means, coupled to each of said first comparator means, for providing a miss signal if all of said output enable signals are in said second logic state;
multiplexer means, coupled to said plurality of address latches, said multiplexer means receiving said first address and providing a second address; and
second comparator means, coupled to said plurality of address latches and to said multiplexer means, said second comparator means for comparing said first address to said second address, and if a match is not detected, causing data to be preloaded from a bank of said nonvolatile memory array to a bank of said volatile memory array.

18. The integrated circuit memory of claim 17, wherein said preload decision logic circuit comprises:
a first logic circuit having a plurality of input terminals for receiving said output enable signals from said first comparator means, and a plurality of output terminals, each output terminal for providing a load signal, said first logic circuit for selecting a bank of said plurality of banks of volatile memory cells to receive data from said plurality of banks of nonvolatile memory cells;
a plurality of one shot circuits, each one shot circuit having an input terminal coupled to an output terminal of said first logic circuit, and an output terminal for providing a preload enable signal that is of sufficient duration for a transfer of data from a bank of said nonvolatile memory array to a bank of said volatile memory array to occur; and
a second logic circuit having a plurality of input terminals, each input terminal coupled to an output terminal of each of said one shot circuits, and an output terminal for providing a wait signal, said wait signal for preventing said volatile memory array from being accessed until said transfer is complete.

19. The integrated circuit memory of claim 17, wherein said logic means performs a logic NOR operation.

20. The integrated circuit memory of claim 18, wherein said first logic circuit uses a least-recently-used algorithm for selecting which bank of said plurality of banks of said volatile memory array is to receive data.

21. The integrated circuit memory of claim 16, wherein said volatile memory cells are characterized as being static random access memory cells, and said nonvolatile memory cells are characterized as being read only memory cells.

22. The integrated circuit memory of claim 16, wherein said volatile memory cells are characterized as being dynamic random access memory cells, and said nonvolatile memory cells are characterized as being read only memory cells.

23. An integrated circuit memory, comprising:
a nonvolatile memory array having a plurality of nonvolatile memory cells, each nonvolatile memory cell coupled to a bit line and to a word line;
a volatile memory array having a plurality of volatile memory cells, each volatile memory cell coupled to a word line and to a bit line, each volatile memory cell of said plurality of volatile memory cells corresponding to N nonvolatile memory cells, where N is an integer greater than one; and
a transfer circuit, coupled to said nonvolatile memory array and to said volatile memory array, said transfer circuit selectively transferring data from a portion of said nonvolatile memory cell array to said volatile memory cell array in response to receiving an address signal.

24. The integrated circuit memory of claim 23, wherein said transfer circuit comprises:
a bank select logic circuit for receiving said address signal, and in response, if said address signal corresponds to a location in said volatile memory array, causing said volatile memory array to be accessed, and if said address does not correspond to a location in said volatile memory array, said bank select logic circuit causing data from said nonvolatile memory array to be transferred to said volatile memory array; and
coupling means, coupled to said bank select logic circuit, said nonvolatile memory array, and to said volatile memory array, for coupling a bit line of said nonvolatile memory array to a bit line pair of said volatile memory array when data is to be transferred from a bank of said nonvolatile memory array to said volatile memory array.

25. The integrated circuit memory of claim 24, wherein said coupling means comprises:
precharge means, coupled to said bit lines and to said bit line pairs, for precharging said bit lines and said bit line pairs to a predetermined voltage in response to receiving a precharge control signal;
an amplifier, coupled to each of said bit line pairs, responsive to an enable signal and to said predetermined voltage, said amplifier for setting said bit line pairs to a predetermined logic state; and
a pass transistor for coupling a bit line of said nonvolatile memory array to a bit line pair of said volatile memory array in response to receiving a data transfer control signal from said bank select logic circuit.

* * * * *